US008610347B2

(12) United States Patent
Song et al.

(10) Patent No.: US 8,610,347 B2
(45) Date of Patent: Dec. 17, 2013

(54) ORGANIC LIGHT EMITTING DIODE DISPLAY INCLUDING A PLURALITY OF PIXELS WITH DIFFERENT THICKNESS OF THE LIGHT EMITTING MEMBER

(75) Inventors: Young-Rok Song, Yongin (KR); Mu-Hyun Kim, Yongin (KR); Beohm-Rock Choi, Yongin (KR); Jung-Bae Song, Yongin (KR); Sang-Pil Lee, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 122 days.

(21) Appl. No.: 13/205,532

(22) Filed: Aug. 8, 2011

(65) Prior Publication Data

US 2012/0098415 A1 Apr. 26, 2012

(30) Foreign Application Priority Data

Oct. 22, 2010 (KR) ........................ 10-2010-0103547

(51) Int. Cl.
*H01J 1/62* (2006.01)
*H05B 33/00* (2006.01)
(52) U.S. Cl.
USPC ............................ 313/504; 313/506; 428/690
(58) Field of Classification Search
USPC .................................. 313/504–506
See application file for complete search history.

(56) References Cited

U.S. PATENT DOCUMENTS

| 2005/0280364 | A1* | 12/2005 | Omura et al. ............... 313/506 |
| 2006/0192220 | A1* | 8/2006 | Nishikawa et al. ............ 257/98 |
| 2006/0214566 | A1* | 9/2006 | Moriyama et al. ............ 313/504 |
| 2009/0212692 | A1* | 8/2009 | Hasegawa .................... 313/504 |

FOREIGN PATENT DOCUMENTS

| JP | 2005-251525 A | 9/2005 |
| KR | 10-2007-0103509 A | 10/2007 |

* cited by examiner

*Primary Examiner* — Sikha Roy
(74) *Attorney, Agent, or Firm* — Knobbe Martens Olson & Bear LLP

(57) ABSTRACT

An organic light emitting diode (OLED) display is disclosed. In one aspect, the OLED display includes a plurality of pixels in a matrix. The OLED display may include a substrate, a translucent layer formed on the substrate, a first electrode formed on the translucent layer, an organic light emitting member formed on the first electrode, and a second electrode formed on the organic light emitting member and including a reflective material. According to some aspects, the thickness of the organic light emitting member of the pixels forming the OLED display may be different than one another, or portions of each pixel may have different thickness for the organic light emitting members forming the pixel. With different thicknesses, the optical characteristics of the pixels forming the OLED display may be effectively compensated for luminance and color purity. As a result, the lateral viewing angle of an OLED display may be improved.

20 Claims, 12 Drawing Sheets

FIG.12

| Ru | Gu | Bu | Ru | Gu | Bu | Ru | Gu | Bu |
|----|----|----|----|----|----|----|----|----|
| Rd | Gd | Bd | Rd | Gd | Bd | Rd | Gd | Bd |
| Ru | Gu | Bu | Ru | Gu | Bu | Ru | Gu | Bu |
| Rd | Gd | Bd | Rd | Gd | Bd | Rd | Gd | Bd |

FIG.13

| Rl | Rr | Gl | Gr | Bl | Br | Rl | Rr | Gl | Gr | Bl | Br | Rl | Rr | Gl | Gr | Bl | Br |
|----|----|----|----|----|----|----|----|----|----|----|----|----|----|----|----|----|----|
| Rl | Rr | Gl | Gr | Bl | Br | Rl | Rr | Gl | Gr | Bl | Br | Rl | Rr | Gl | Gr | Bl | Br |

ORGANIC LIGHT EMITTING DIODE DISPLAY INCLUDING A PLURALITY OF PIXELS WITH DIFFERENT THICKNESS OF THE LIGHT EMITTING MEMBER

CROSS-REFERENCE TO RELATED APPLICATIONS

This application claims priority to and the benefit of Korean Patent Application No. 10-2010-0103547 filed in the Korean Intellectual Property Office on Oct. 22, 2010, the entire contents of which are incorporated herein by reference.

BACKGROUND

1. Field

The disclosed technology relates generally to an organic light emitting diode (OLED) display.

2. Description of the Related Technology

An organic light emitting diode (OLED) display includes two electrodes and an organic emission layer disposed between the two electrodes. Electrons injected from one electrode and holes injected from the other electrode are combined in the organic emission layer such that excitons are formed. Light is then emitted by energy generated from the excitons.

The organic light emitting diode (OLED) display is classified as a top light emitting type organic light emitting diode (OLED) display and a bottom light emitting type organic light emitting diode (OLED) display. The top light emitting type organic light emitting diode (OLED) display includes a cathode formed of indium tin oxide (ITO) having high resistance such that it is applied to a large sized organic light emitting diode (OLED) display. Accordingly, a large sized organic light emitting diode (OLED) display is constructed with a bottom light emitting type of organic light emitting diode (OLED) display including a low resistance material such as silver (Ag) as the cathode.

A bottom light emitting type of organic light emitting diode (OLED) display has a low color gamut and low luminous efficiency compared with the top light emitting type of organic light emitting diode (OLED) display. Therefore, a micro-cavity may be applied to the bottom light emitting type of organic light emitting diode (OLED) to compensate for these deficiencies. In a micro-cavity, light is repeatedly reflected between a reflection layer and a translucent layer that are separated by a predetermined distance such that a strong interference effect is generated in the light. Based on the micro-cavity spacing, light of a specific wavelength becomes constructive, and light of remaining wavelengths is destructive. The organic light emitting diode (OLED) display including the micro-cavity has luminance that increases and high color purity at a front side. However, the viewing angle characteristic of the lateral or peripheral side of the organic light emitting diode (OLED) display including the micro-cavity is inversely proportional to the characteristic of the front side. That is, the luminance is deteriorated and the color purity is decreased according to the viewing angle. To solve this problem, an additional optical film may be applied or an additional structure may be formed under the organic light emitting diode (OLED) display. However, including additional films or structures may increase the production cost and energy consumption of the display, or may reduce the yield of the display. The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

An organic light emitting diode (OLED) display capable of preventing deterioration of luminance and color purity according to the viewing angle in a bottom light emitting type including a micro-cavity is disclosed.

According to one aspect, an organic light emitting diode (OLED) display including a plurality of pixels disposed in a matrix, wherein the organic light emitting diode (OLED) display includes a substrate, a translucent layer formed on the substrate, a first electrode formed on the translucent layer, an organic light emitting member formed on the first electrode, and a second electrode formed on the organic light emitting member, wherein the second electrode includes a reflective material, wherein the thickness of the organic light emitting member positioned at the left portion in one pixel and the thickness of the organic light emitting member positioned at the right portion in one pixel are different from each other.

According to one aspect, an organic light emitting diode (OLED) display including a plurality of pixels disposed in a matrix, wherein the organic light emitting diode (OLED) display includes a substrate a translucent layer formed on the substrate, a first electrode formed on the translucent layer, an organic light emitting member formed on the first electrode, and a second electrode formed on the organic light emitting member, wherein the second electrode includes a reflective material. wherein the thickness of the organic light emitting member of the odd-numbered row pixel positioned at an odd-numbered row among a plurality of pixels corresponds to a first thickness and the thickness of the organic light emitting member of an even-numbered row pixel positioned at an even-numbered row corresponds to a second thickness, and wherein the first thickness and the second thickness are different from each other.

According to one aspect, an organic light emitting diode (OLED) display including a plurality of pixels disposed in a matrix, wherein the organic light emitting diode (OLED) display includes a substrate, a translucent layer formed on the substrate, a first electrode formed on the translucent layer, an organic light emitting member formed on the first electrode, and a second electrode formed on the organic light emitting member, wherein the second electrode includes a reflective material, wherein the thickness of the organic light emitting member of an odd-numbered column pixel positioned at an odd-numbered column among a plurality of pixels corresponds to a first thickness, and the thickness of the organic light emitting member of an even-numbered column pixel positioned at an even-numbered column corresponds to a second thickness, and wherein the first thickness and the second thickness are different from each other.

According to one aspect, an organic light emitting diode (OLED) display including a plurality of pixels disposed in a matrix, wherein the organic light emitting diode (OLED) display includes: a substrate, a translucent layer formed on the substrate; a first electrode formed on the translucent layer, an organic light emitting member formed on the first electrode, and a second electrode formed on the organic light emitting member, wherein the second electrode includes a reflective material, wherein the thickness of the organic light emitting member positioned at the upper portion in one pixel and the thickness of the organic light emitting member positioned at the lower portion in one pixel are different from each other.

BRIEF DESCRIPTION OF THE DRAWINGS

FIG. 12 is a schematic diagram showing an arrangement of a plurality of pixels in an organic light emitting diode (OLED) display according to some embodiments.

FIG. 13 is a schematic diagram showing an arrangement of a plurality of pixels in an organic light emitting diode (OLED) display according to some embodiments.

DETAILED DESCRIPTION OF CERTAIN INVENTIVE EMBODIMENTS

Figure 1:
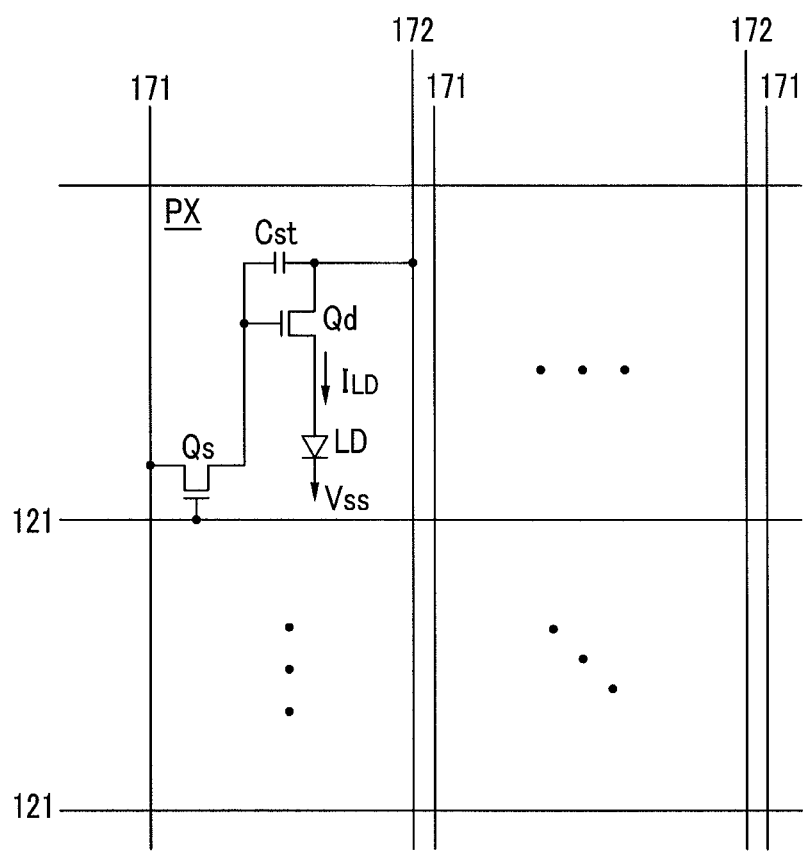
FIG. 1 illustrates a circuit of an organic light emitting diode (OLED) display according to some embodiments.

Hereinafter, various embodiments have been shown and described in detail with reference to the accompanying drawings. However, the various embodiments are exemplary and the scope of the present invention may be modified in various different ways, and is not limited to the embodiments described herein.

Like elements having the same structures throughout the embodiments are denoted by the same reference numerals and are commonly described. Throughout the description section, a description of like elements may be omitted such that elements other than the like elements are described.

To clearly describe the exemplary embodiments, parts not related on by the description are omitted, and like reference numerals designate like elements throughout the specification.

In addition, the size and thickness of each component shown in the drawings are arbitrarily shown for understanding and ease of description. However, the sizes and thicknesses illustrated are not limiting but may be variously configured. In the drawings, the thickness of layers, films, panels, regions, etc., are exaggerated for clarity. In addition, in the drawings, for understanding and ease of description, the thicknesses of some layers and areas are exaggerated and may not reflect relative thicknesses of the layers. It will be understood that when an element such as a layer, film, region, or substrate is referred to as being "on" another element, it can be directly on the other element or intervening elements may also be present.

An organic light emitting diode (OLED) display according to some embodiments will be described with reference to FIG. 1.

FIG. 1 illustrates a circuit of an organic light emitting diode (OLED) display according to some embodiments. Referring to FIG. 1, the organic light emitting display apparatus according to some embodiments includes a plurality of signal lines 121, 171, and 172, and a plurality of pixels PX that are connected to the signal lines and are arranged substantially in a matrix.

The signal lines include a plurality of gate lines 121 that transmit gate signals (or scanning signals), a plurality of data lines 171 that transmit data signals, and a plurality of driving voltage lines 172 that transmit driving voltages. The gate lines 121 extend substantially in a row direction, and are substantially parallel to each other. The data lines 171 and the driving voltage lines 172 extend substantially in a column direction, and are substantially parallel to each other.

Each of the pixels PX may include a switching transistor Qs, a driving transistor Qd, and an organic light emitting diode (OLED) LD. The switching thin film transistor Qs has a control terminal, an input terminal, and an output terminal. The control terminal of the switching thin film transistor Qs is connected to the gate line 121, the input terminal is connected to the data line 171, and the output terminal is connected to the driving thin film transistor Qd. The switching thin film transistor Qs may transmit a data signal applied to the data line 171 to the driving thin film transistor Qd in response to the scanning signal applied to the gate line 121.

The driving thin film transistor Qd may also include a control terminal, an input terminal, and an output terminal. The control terminal of the driving thin film transistor Qd is connected to the switching thin film transistor Qs, the input terminal is connected to the driving voltage line 172, while the output terminal thereof connected to the organic light emitting diode LD. The driving thin film transistor Qd differentiates the flow of output currents $I_{LD}$ in dimension depending on the voltage difference between the control and output terminals.

A capacitor Cst may be disposed between the control and input terminals of the driving thin film transistor Qd such that it interconnects the control and input terminals. The capacitor Cst is charged with the data signals applied to the control terminal of the driving thin film transistor Qd, and stores them even after the switching thin film transistor Qs turns off.

The organic light emitting diode LD has an anode connected to the output terminal of the driving thin film transistor Qd and a cathode connected to a common voltage Vss. The organic light emitting diode LD emits light that is varied in intensity depending upon the output current ILD of the driving thin film transistor Qd to thereby display images.

The switching thin film transistor Qs and the driving thin film transistor Qd as illustrated in FIG. 1 are n-channel field effect transistor (FET). However, at least one of the switching thin film transistor Qs and the driving thin film transistor Qd may be a p-channel field effect transistor. Furthermore, the interconnection relationships among the thin film transistors Qs and Qd, the capacitor Cst, and the organic light emitting diode LD may be varied.

Figure 2:
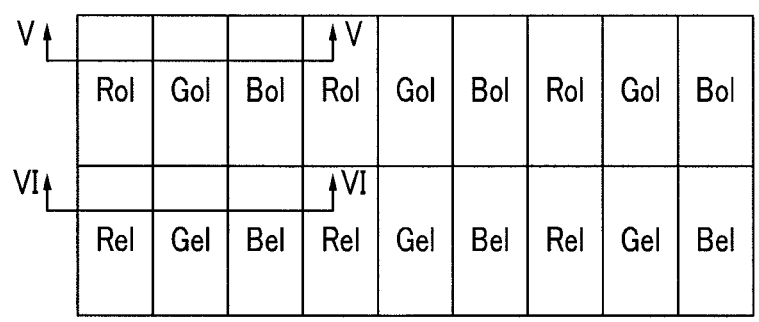
FIG. 2 illustrates a schematic diagram showing an arrangement of a plurality of pixels in an organic light emitting diode (OLED) display according to some embodiments.
Figure 3:
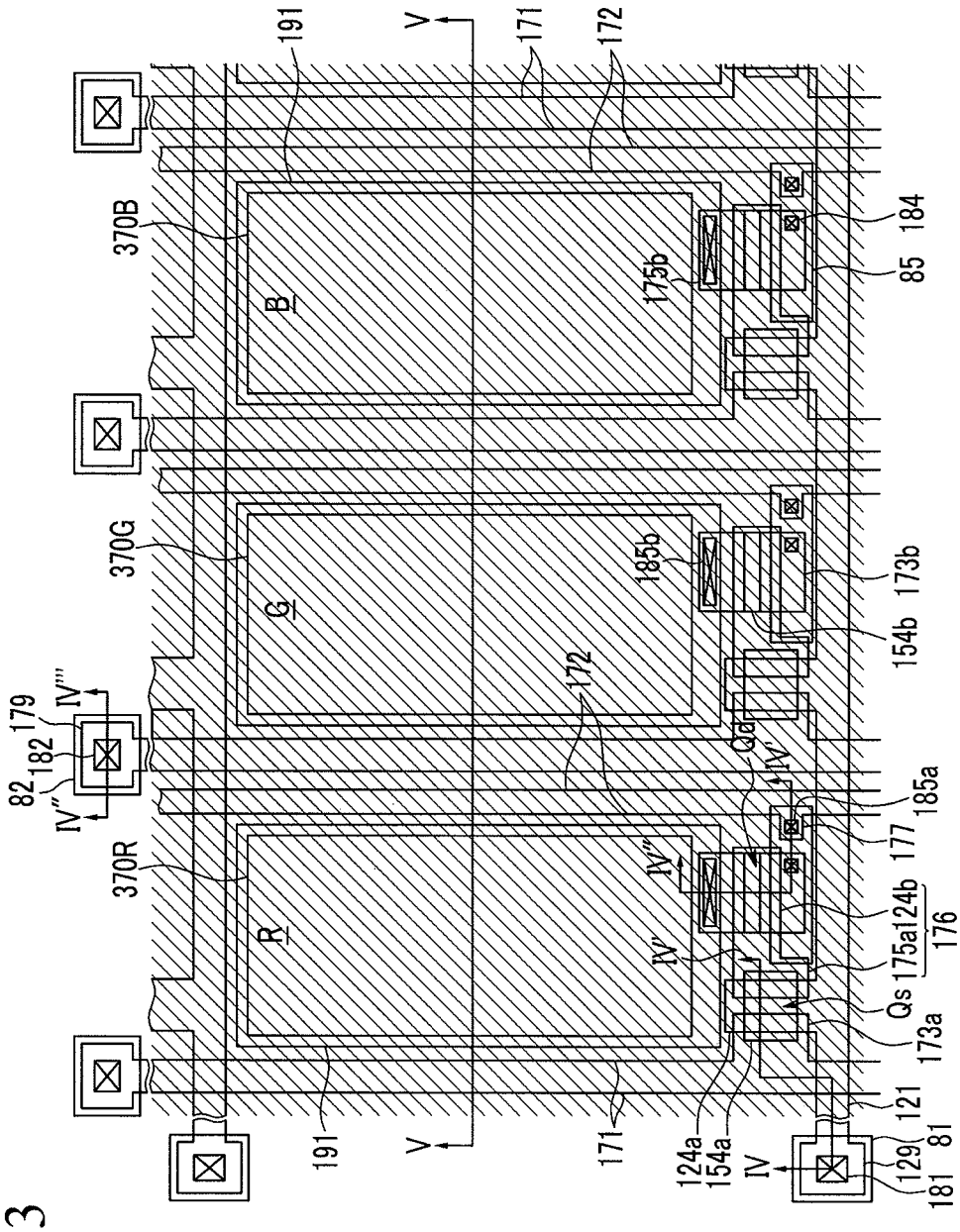
FIG. 3 illustrates a layout view showing three pixels in an organic light emitting diode (OLED) display according to some embodiments.
Figure 4:
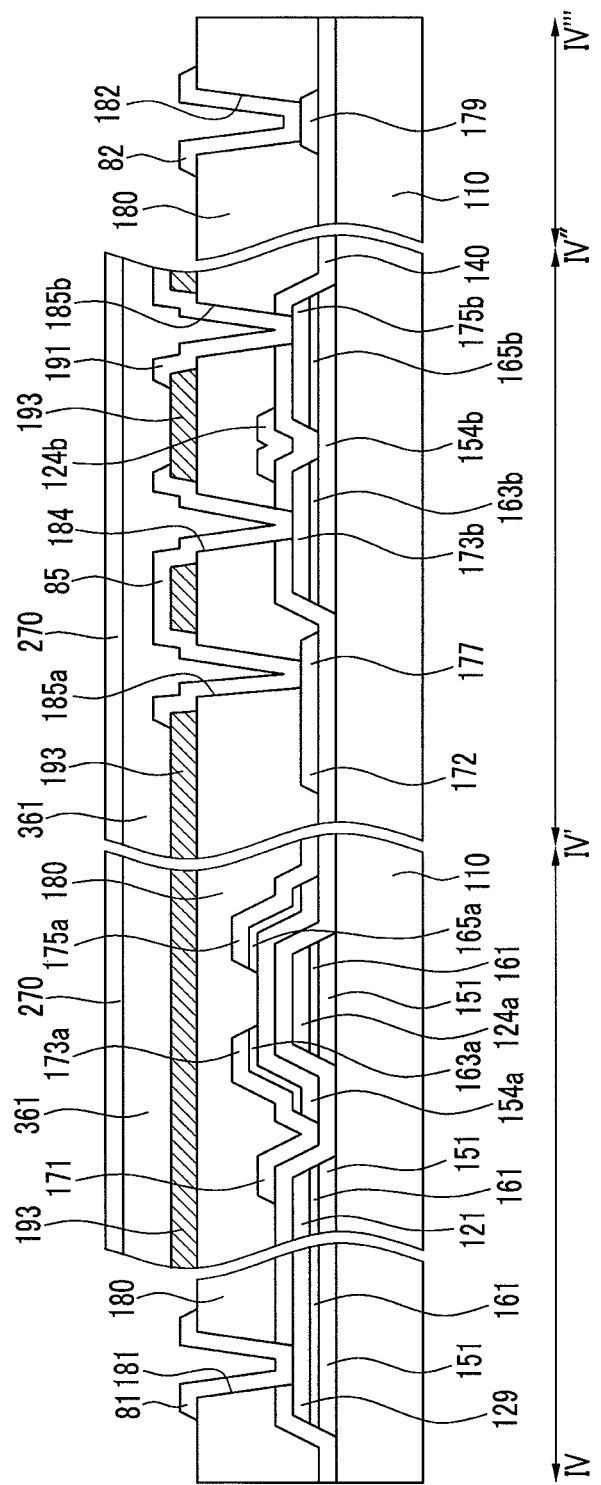
FIG. 4 is a cross-sectional view of the organic light emitting diode (OLED) display of FIG. 3 taken along the line IV-IV'-IV"-IV'".
Figure 5:
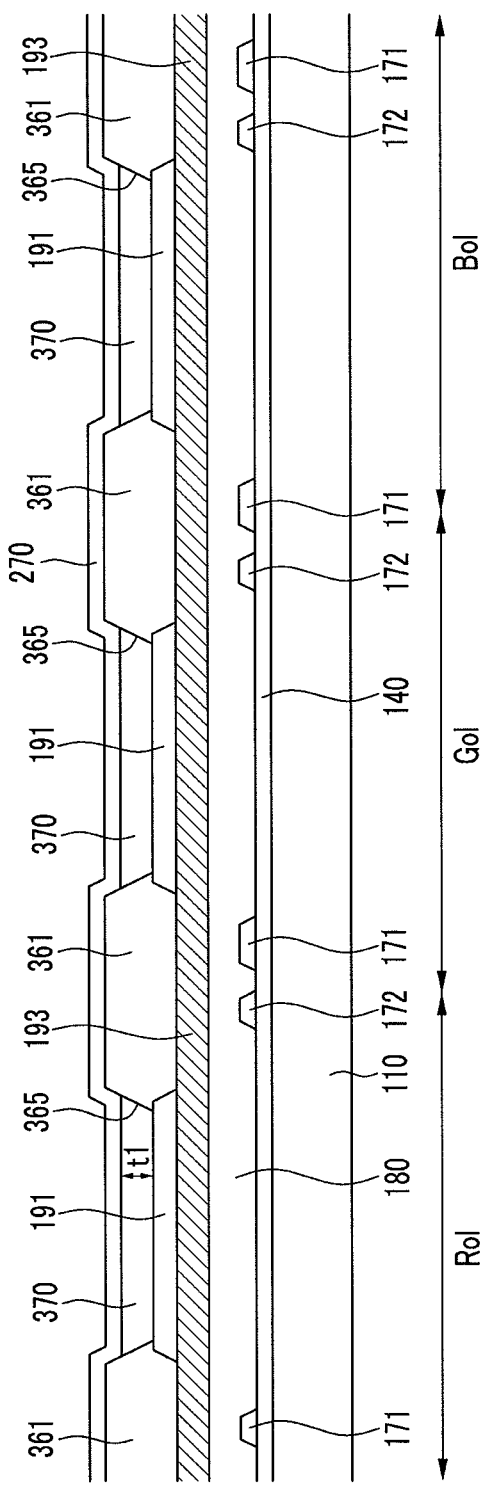
FIG. 5 is a cross-sectional view of the organic light emitting diode (OLED) display of FIG. 3 taken along the line V-V.
Figure 6:
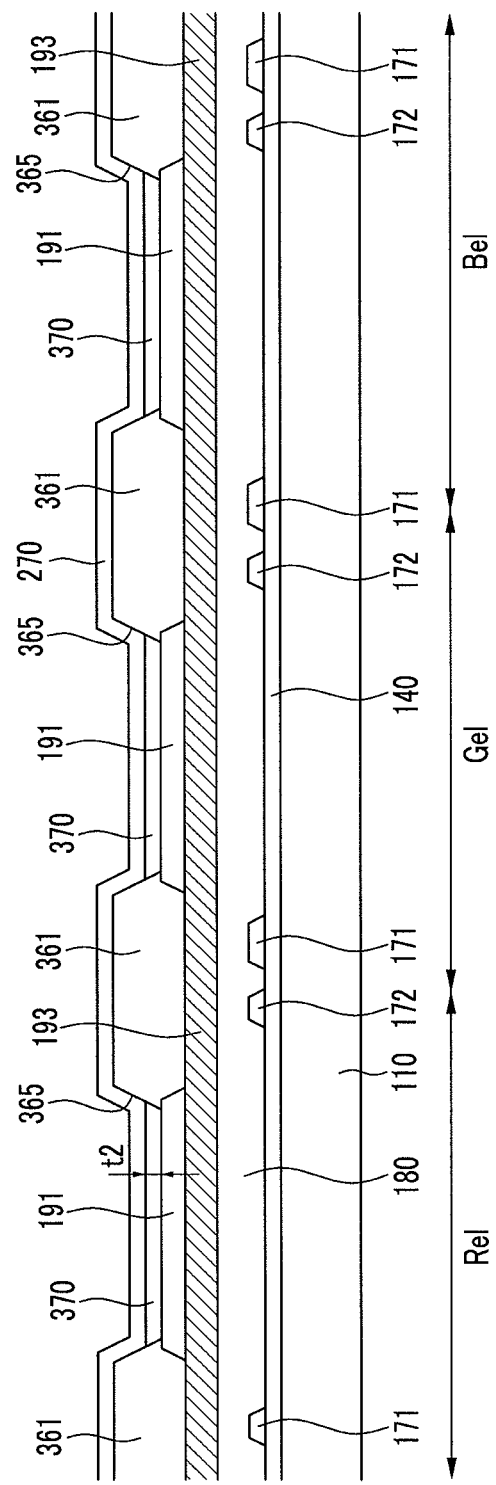
FIG. 6 is a cross-sectional view of the organic light emitting diode (OLED) display of FIG. 2 taken along the line VI-VI.

The specific structure of the organic light emitting display shown in FIG. 1 will now be described with reference to FIG. 2 to FIG. 6, FIG. 2 is a schematic diagram illustrating an arrangement of a plurality of pixels in an organic light emitting diode (OLED) display according to some embodiments. FIG. 3 is a layout view showing three pixels in the organic light emitting diode (OLED) display according to some embodiments. FIG. 4 is a cross-sectional view of the organic light emitting diode (OLED) display of FIG. 3 taken along the line IV-IV'-IV"-IV'". FIG. 5 is a cross-sectional view of the organic light emitting diode (OLED) display of FIG. 3 taken along the line V-V. FIG. 6 is a cross-sectional view of the organic light emitting diode (OLED) display of FIG. 2 taken along the line VI-VI.

With reference to FIG. 2, in a first odd-numbered row of the organic light emitting diode (OLED) display according to some embodiments, a red pixel Rol displaying red, a green pixel Gol displaying green, and a blue pixel Bol displaying blue are alternately disposed. Three pixels of a red pixel Rol, a green pixel Gol, and a blue pixel Bol form a pixel group, and are repeatedly arranged according to rows.

Furthermore, in the first even-numbered row, a red pixel Rel, a green pixel Gel, and a blue pixel Bel are alternately disposed. Three pixels of a red pixel Rel, a green pixel Gel, and a blue pixel Bel form one pixel group, and may be repeatedly arranged according to rows.

As illustrated in FIG. 2, pixels of the same color may be disposed in the same column. The red pixels Rol and Rel may be disposed in the first red odd-numbered column, the green pixels Gol and Gel may be disposed in the first green odd-numbered column, and the blue pixels Bol and Bel may be disposed in the first blue odd-numbered column. Furthermore, the red pixels Rol and Rel may be disposed in the first red even-numbered column, the green pixels Gol and Gel may be disposed in the first green even-numbered column, and the blue pixels Bol and Bel may be disposed in the first blue even-numbered column. Further, the red pixels Rol and Rel may be disposed in the second red odd-numbered column, the green pixels Gol and Gel may be disposed in the second green odd-numbered column, and the blue pixels Bol and Bel may be disposed in the second blue odd-numbered column.

The embodiment illustrated by FIG. 2 only shows the pixel arrangement of 2 rows and 9 columns as the portion of all pixel arrangements, however various exemplary embodiments including any number of rows and columns are possible.

The detailed structure of the organic light emitting diode (OLED) display of FIG. 2 will be described with reference to FIG. 3 to FIG. 6.

FIG. 3 illustrates one pixel group including the red pixel Rol, the green pixel Gol, and the blue pixel Bol that are disposed in the first odd-numbered row in an organic light emitting diode (OLED) display according to some embodiments. The three pixels may each include a gate line 121, a data line 171, a driving voltage line 172, a switching thin film transistor Qs, and a driving thin film transistor Qd. Each of the pixels may have the same structure. Accordingly, like elements are designated by the same reference numerals.

As illustrated in FIGS. 4-6, a plurality of driving semiconductors 154b and a plurality of semiconductor stripes 151 may be formed on an insulating substrate 110.

The driving semiconductors 154b have an island shape, and the semiconductor stripes 151 are extended in the transverse direction. The driving semiconductors 154b and the semiconductor stripes 151 may be made of a semiconductor material such as crystalline silicon or amorphous silicon.

A plurality of gate lines 121, a plurality of driving input electrodes 173b, and a plurality of driving output electrodes 175b are formed on the driving semiconductors 154b and the semiconductor stripes 151.

The gate lines 121 transmit gate signals and are substantially extended in the horizontal direction. Each gate line 121 includes a plurality of switching control electrodes 124a projecting upward from the gate line 121, and an end portion 129 having a large area for contact with another layer or an external driving circuit. The gate lines 121 have substantially the same planar shape as the semiconductor stripes 151.

The driving input electrodes 173b and the driving output electrodes 175b each are formed to have an island shape, and are separated from the gate lines 121. The driving input electrodes 173b and the driving output electrodes 175b are opposite to each other on the driving semiconductors 154b.

A plurality of pairs of ohmic contacts 163b and 165b are formed between the driving semiconductors 154b and the driving input electrodes 173b, and the semiconductor islands 154b and the driving output electrodes 175b, respectively. Furthermore, a plurality of the impurity doping portions 161 doped with an impurity are formed between the gate lines 121 and the semiconductor stripes 151.

The ohmic contacts 163b and 165b and the impurity doping portions 161 are preferably made of a crystalline semiconductor material doped with an impurity such as polysilicon, microcrystalline silicon heavily doped with an n-type impurity such as phosphorous, or an amorphous semiconductor material.

A gate insulating layer 140 may be formed on the gate lines 121, the driving input electrodes 173b, and the driving output electrodes 175b.

A plurality of switching semiconductors 154a preferably made of hydrogenated amorphous silicon may be formed on the gate insulating layer 140. The switching semiconductors 154a have an island shape, and overlap the switching control electrodes 124a.

A plurality of the data lines 171, a plurality of the driving voltage lines 172, and a plurality of electrode members 176 may be formed on the switching semiconductors 154a and the gate insulating layer 140.

The data lines 171 for transmitting data signals extend substantially in the longitudinal direction and intersect the gate lines 121. Each data line 171 may include a plurality of switching input electrodes 173a extended toward the switching control electrodes 124a and an end portion 179 having a large area for contact with another layer or an external driving circuit.

The driving voltage lines 172 for transmitting driving voltages extend substantially in the longitudinal directional, intersect the gate lines 121, and are parallel to the data lines 171. Each of the driving voltage lines 172 includes a plurality of protrusions 177.

As illustrated in FIG. 3, the electrode members 176 may have an island shape, and are separated from the data lines 171 and the driving voltage lines 172. The electrode members 176 each include one portion 175a (hereinafter referred to as a "switching output electrode") opposite to the switching input electrodes 173a. The electrode members may also include other portions 124b (hereinafter referred to as a "driving control electrode") overlapping the driving semiconductors 154b. The switching input electrodes 173a and the switching output electrodes 175a are opposite one another on the switching semiconductors 154a.

A plurality of pairs of ohmic contacts 163a and 165a are respectively formed between the switching semiconductors 154a and the switching input electrodes 173a, and the switching semiconductors 154a and the switching output electrode 175a, respectively.

A passivation layer 180 may be formed on the data lines 171, the driving voltage lines 172, and the electrode members 176. The passivation layer 180 may have a plurality of contact holes 185a and 182 respectively exposing the protrusions 177 of the driving voltage lines 172 and the end portions 179 of the data lines 171. The passivation layer 180 and the gate insulating layer 140 may have a plurality of contact holes 181, 184, and 185b respectively exposing the end portions 129 of the gate lines 121, the driving input electrodes 173b, and the driving output electrodes 175b.

A translucent member 193 may be formed on the passivation layer 180. The translucent member 193 may be formed over the whole surface of the substrate including the red pixel Rol, the green pixel Gol, and the blue pixel Bol. The translucent member 193 may be configured as a partially reflective surface such that a portion of light is transmitted and a portion of light is reflected. The translucent member 193 may be configured to use a distributed Bragg reflection (DBR) for controlling the reflection ratio of a specific wavelength.

The translucent member 193 along with the common electrode 270 generate a micro-cavity effect. The micro-cavity effect occurs when light is repeatedly reflected between a reflection layer and translucent layers, which are spaced from each other by a predetermined distance such that light of a predetermined wavelength is enhanced by constructive interference. The common electrode 270 may function as a reflection layer, and the translucent member 193 may function as a translucent layer.

A plurality of pixel electrodes 191, a plurality of connecting members 85, and a plurality of contact assistants 81 and 82 may be formed on the translucent member 193. The pixel electrodes 191 may be connected to the driving output electrodes 175b through the contact holes 185b.

The connecting members 85 are respectively connected to the protrusions 177 of the driving voltage lines 172 and the driving input electrodes 173b through the contact holes 184 and 185a, and form storage capacitors Cst by overlapping portions of the driving control electrodes 124b.

The contact assistants 81 and 82 are connected to the end portions 129 of the gate lines 121 and the end portions 179 of the data lines 171 through the contact holes 181 and 182, respectively. The pixel electrodes 191, the connecting members 85, and the contact assistants 81 and 82 are preferably made of a transparent conductor such as ITO or IZO.

An insulating bank 361 may be formed on the pixel electrodes 191, the connecting members 85, and the contact assistants 81 and 82. The bank 361 surrounds the edges of the pixel electrodes 191 to define openings 365. A plurality of organic light emitting members 370 may be formed on the bank 361 and the pixel electrodes 191. The organic light emitting members may include an auxiliary layer (not shown) for improving light emitting efficiency as well as light emission layers 370R, 370G, and 370B for emitting light. In addition, the auxiliary layer may include an electron transport layer (not shown) and a hole transport layer (not shown), and an electron injecting layer (not shown) and a hole injecting layer (not shown).

The common electrode 270 may be formed on the organic light emitting members 370. The common electrode 270 is preferably made of a material with a high reflection rate. The common electrode 270 is formed over the whole surface of the substrate 110, and forms a pair with each pixel electrode 191 to flow the current to the organic light emitting members.

The common electrode 270 changes the light emitting characteristics of the light from the light emission layers 370R and 370B, and light near a wavelength corresponding to each resonance wavelength among the changed light is enhanced through the translucent member 193, while light of different wavelengths is suppressed. Here, the enhancement and the suppression of the specific wavelengths are determined by the micro-cavity length. The micro-cavity length may be controlled by the thickness of the translucent member 193.

The pixel electrodes 191, the light emission layers 370R, 370G, and 370B, and the common electrode 270 form organic light emitting diodes LD. The pixel electrodes 191 may be configured as anodes and the common electrode 270 as a cathode, or the pixel electrodes 191 may be configured as cathodes and the common electrode 270 as an anode.

FIG. 6 is a cross-sectional view showing one pixel group including the red pixel Rel, the green pixel Gel, and the blue pixel Bel disposed in the first even-numbered row in the organic light emitting diode (OLED) display according to some embodiments.

The structure of the red pixel Rol, the green pixel Gol, and the blue pixel Bol is similar to the structure of the pixels disposed in the first odd-numbered row shown in FIG. 5, however, the thickness t2 of the organic light emitting member 370 is different.

The relation between the thickness t1 of the organic light emitting member 370 of the pixel disposed in the first odd-numbered row and the thickness t2 of the organic light emitting member 370 of the pixel disposed in the first even-numbered row will be described with reference to FIG. 7 and FIG. 8.

Figure 7:
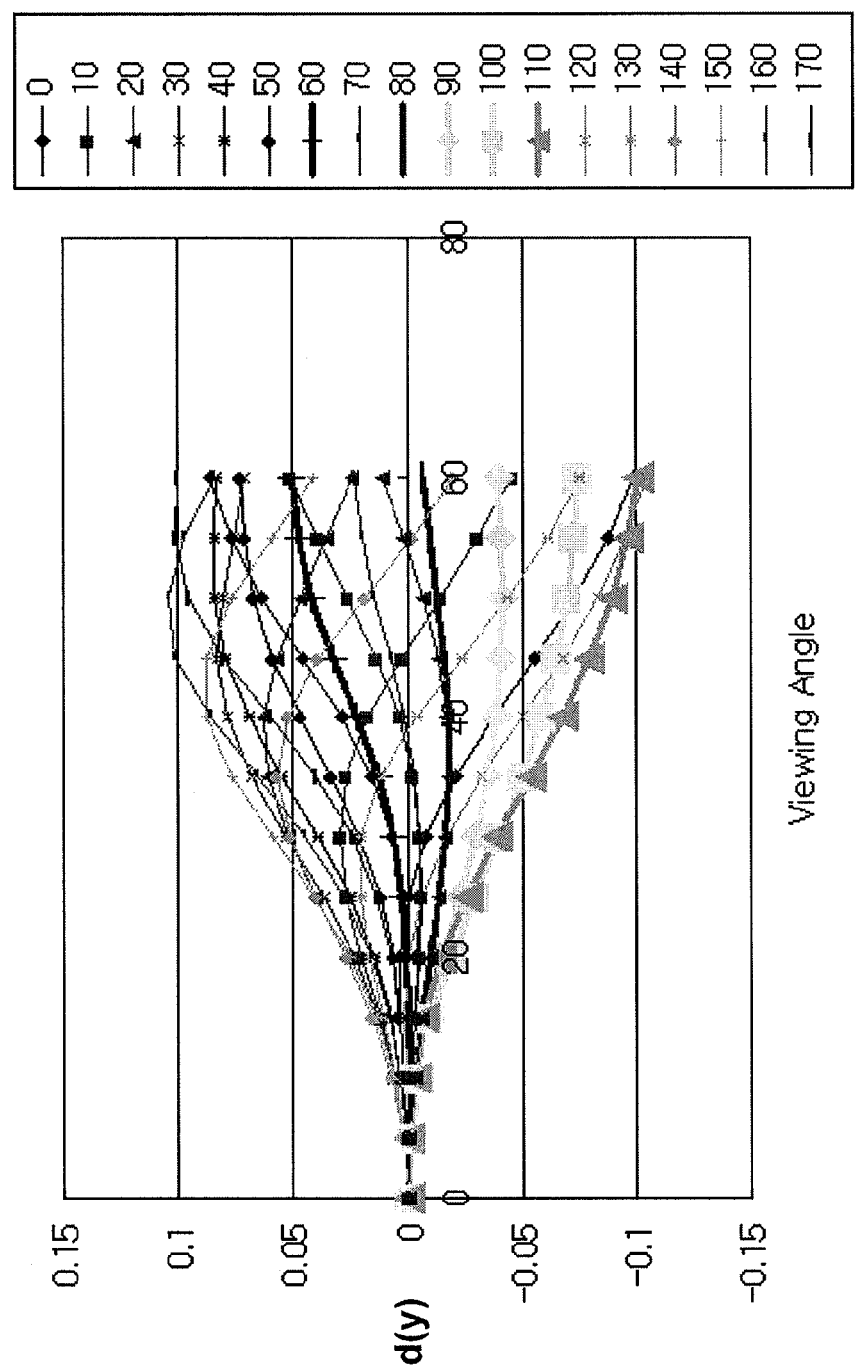
FIG. 7 is a graph showing a y-axis change d(y) of a C.I.E. color coordinate of a blue pixel according to the thickness and viewing angle of an organic light emitting member in an organic light emitting diode (OLED) display according to some embodiments.

FIG. 7 is a graph showing a y-axis change d(y) of a C.I.E. color coordinate of a blue pixel according to thickness and viewing angle of an organic light emitting member in an organic light emitting diode (OLED) display according to some embodiments.

As shown in FIG. 7, the change d(y) of the blue pixel is changed according to the viewing angle such that the color coordinate is changed according to the viewing angle, and thereby the color purity is deteriorated. However, the change d(y) according to the viewing angle for the organic light emitting member having the thickness of 0 nm to 180 nm is mostly changed in a range between about −0.1 to 0.1 such that the change amount of the color coordinate according to the viewing angle is small, and thereby the color purity is not largely decreased.

Accordingly, the thickness of the organic light emitting member of the first odd-numbered row pixel and the first even-numbered row pixel may be a thickness for which the change d(y) according to the viewing angle for the first odd-numbered row pixel and the first even-numbered row pixel is in the range of about −0.1 to 0.1.

Figure 8:
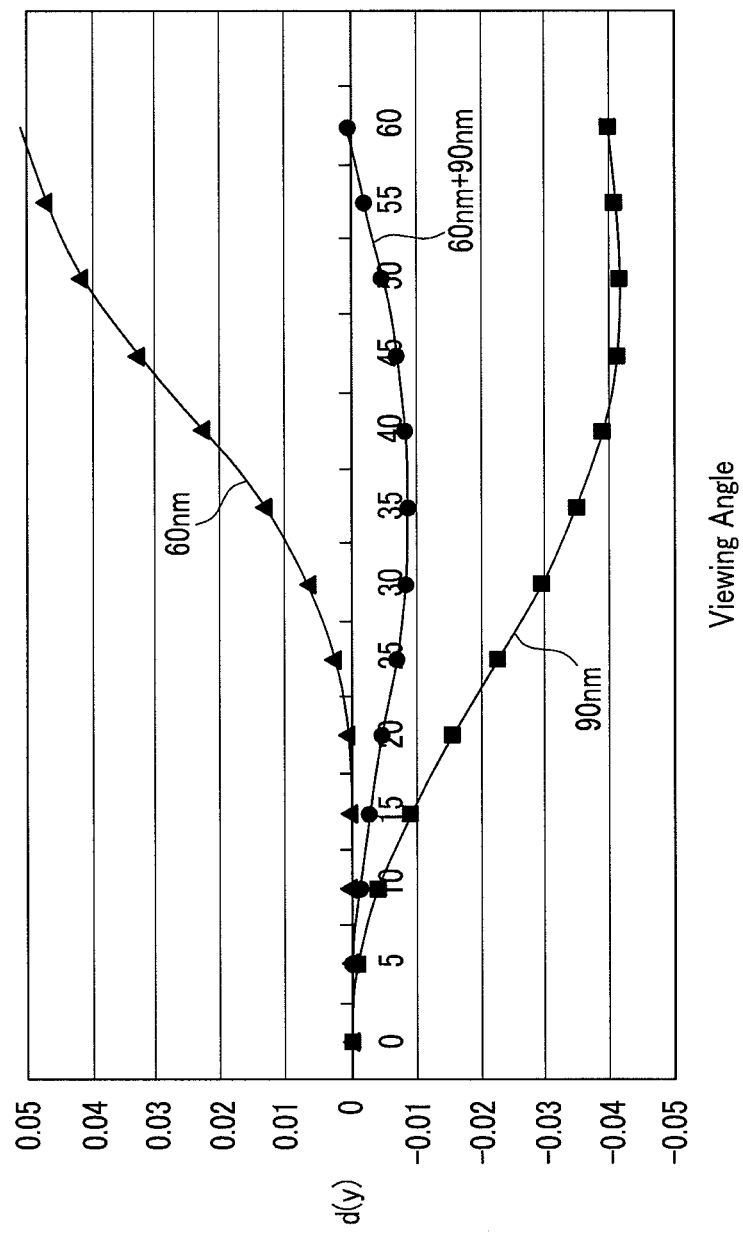
FIG. 8 is a graph showing a y-axis change d(y) of a C.I.E. color coordinate of a blue pixel according to a viewing angle at various thicknesses of an organic light emitting member according to the some embodiments.

FIG. 8 is a graph showing a y-axis change d(y) of a C.I.E. color coordinate of a blue pixel according to a viewing angle when the thickness of an organic light emitting member of all blue pixels is 60 nm, the thickness of an organic light emitting member of all blue pixels is 90 nm, the thickness of an organic light emitting member of the first odd-numbered row pixel is 60 nm, and the thickness of an organic light emitting member of the first even-numbered row pixel is 90 nm in an organic light emitting diode (OLED) display according to some embodiments.

Table 1 illustrates values of an x-axis, a y-axis, and a normalized L of a C.I.E. color coordinate of a blue pixel according to the viewing angle when the thickness of an organic light emitting member of all blue pixels is 60 nm, the thickness of an organic light emitting member of all blue pixels is 90 nm, the thickness of an organic light emitting member of the first odd-numbered row pixel is 60 nm, and the thickness of an organic light emitting member of the first even-numbered row pixel is 90 nm in an organic light emitting diode (OLED) display according to some embodiments.

TABLE 1

| viewing angle | 60 nm | | | 90 nm | | | 60 nm + 90 nm | | |
|---|---|---|---|---|---|---|---|---|---|
| | x | y | L | x | y | L | x | y | L |
| 0  | 0.150 | 0.046 | 100 | 0.130 | 0.088 | 100 | 0.141 | 0.064 | 100 |
| 5  | 0.150 | 0.046 | 99  | 0.131 | 0.087 | 99  | 0.141 | 0.064 | 99  |
| 10 | 0.151 | 0.045 | 97  | 0.131 | 0.084 | 97  | 0.142 | 0.063 | 9   |
| 15 | 0.151 | 0.045 | 93  | 0.133 | 0.079 | 94  | 0.143 | 0.061 | 93  |
| 20 | 0.153 | 0.046 | 88  | 0.135 | 0.072 | 89  | 0.144 | 0.059 | 89  |
| 25 | 0.154 | 0.048 | 82  | 0.138 | 0.065 | 84  | 0.145 | 0.057 | 83  |
| 30 | 0.154 | 0.052 | 77  | 0.141 | 0.059 | 78  | 0.147 | 0.056 | 77  |
| 35 | 0.155 | 0.059 | 72  | 0.144 | 0.053 | 71  | 0.148 | 0.055 | 71  |
| 40 | 0.154 | 0.068 | 68  | 0.147 | 0.049 | 64  | 0.149 | 0.056 | 66  |
| 45 | 0.154 | 0.079 | 64  | 0.149 | 0.047 | 57  | 0.150 | 0.057 | 60  |
| 50 | 0.153 | 0.087 | 62  | 0.150 | 0.047 | 49  | 0.151 | 0.059 | 54  |
| 55 | 0.153 | 0.093 | 59  | 0.151 | 0.047 | 42  | 0.152 | 0.062 | 49  |
| 60 | 0.154 | 0.096 | 57  | 0.152 | 0.048 | 37  | 0.152 | 0.065 | 45  |

As illustrated in FIG. 8 and Table 1, when the thickness of an organic light emitting member of all blue pixels is 60 nm, the change d(y) according to the viewing angle of the blue pixel has a positive slope and is increased. When the thickness of an organic light emitting member of all blue pixels is 90 nm, the change d(y) according to the viewing angle of the blue pixel has a negative slope and is decreased. Therefore, it may be confirmed that the color purity is deteriorated according to the viewing angle. However, when the thickness of an organic light emitting member of the first odd-numbered row pixel is 60 nm and the thickness of an organic light emitting member of the first even-numbered row pixel is 90 nm, the change d(y) according to the viewing angle of the first odd-numbered row pixel has the positive slope and the d(y) according to the viewing angle of the first even-numbered row pixel has the negative slope such that the change d(y) according to the viewing angle of all blue pixels are in the range of 0 to −0.01. Therefore it may be confirmed that the change of the color coordinate is small and the color purity is not largely deteriorated.

As described above, the thickness t1 of the organic light emitting member of the first odd-numbered row pixel and the thickness t2 of the organic light emitting member of the first even-numbered row pixel are determined for the change d(y) according to the viewing angle of the first odd-numbered row pixel to have the positive slope and for the change d(y) according to the viewing angle of the first even-numbered row pixel to have the negative slope. Therefore, the optical characteristics of the first odd-numbered row pixel and the first even-numbered row pixel may compensate for one another such that the later viewing angle is improved.

Also, as illustrated in Table 1, the change d(x) of the x-axis of the C.I.E. color coordinate according to the viewing angle of the blue pixel is small relative to the change d(y) of the y-axis of the C.I.E. color coordinate according to the viewing angle of the blue pixel. As a result, it may be confirmed that the change d(x) of the x-axis does not largely influence the color purity. Also, the change d(x) of the x-axis and the change d(y) of the y-axis of the C.I.E. color coordinate according to the viewing angle for the red pixel and the green pixel are also small compared with the change d(y) of the y-axis of the C.I.E. color coordinate according to the viewing angle of the blue pixel such that the color purity is not largely influenced.

On the other hand, according to some embodiments, the thicknesses of the organic light emitting member 370 of the odd-numbered row pixel and the even-numbered row pixel are different from each other to compensate the optical characteristics of the odd-numbered row pixel and the even-numbered row pixel for improving the lateral viewing angle. However the thicknesses of the organic light emitting member 370 of the odd-numbered column pixel and the even-numbered column pixel of the same color may be different from each other to improve the lateral viewing angle.

Next, a structure in which the thicknesses of the organic light emitting member 370 of the odd-numbered column pixel and the even-numbered column pixel of the same color are different from each other in the organic light emitting diode (OLED) display according to the some embodiments will be described with reference to FIGS. 9 to 11.

Figure 9:
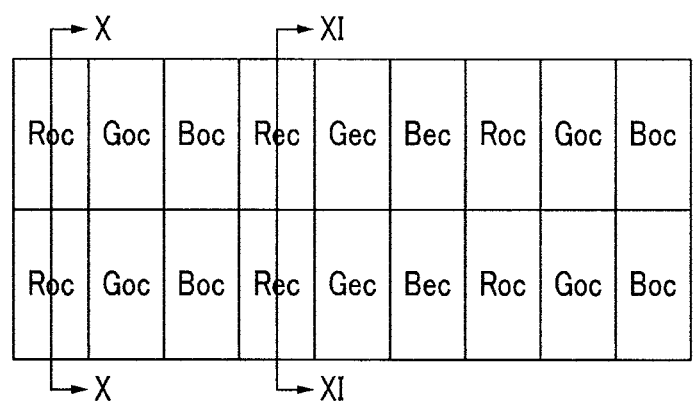
FIG. 9 is a schematic diagram showing an arrangement of a plurality of pixels in an organic light emitting diode (OLED) display according to the some embodiments.
Figure 10:
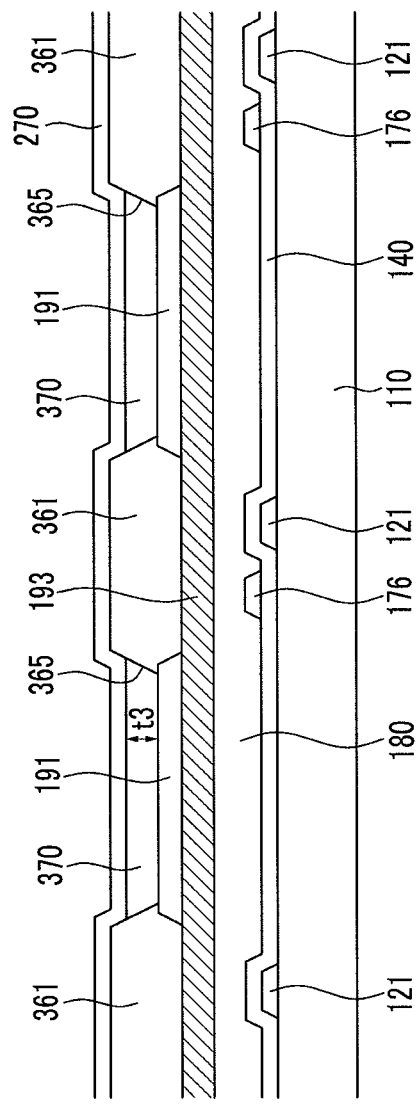
FIG. 10 is a cross-sectional view of an organic light emitting diode (OLED) display of FIG. 9 taken along the line X-X.
Figure 11:
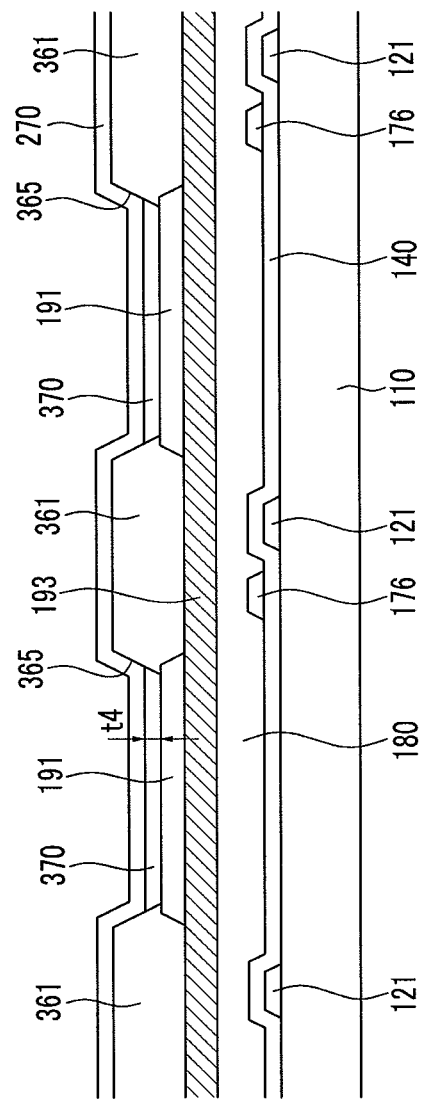
FIG. 11 is a cross-sectional view of an organic light emitting diode (OLED) display of FIG. 9 taken along the line XI-XI.

FIG. 9 is a schematic diagram illustrating an arrangement of a plurality of pixels in an organic light emitting diode (OLED) display according to some embodiments, FIG. 10 is a cross-sectional view of the organic light emitting diode (OLED) display of FIG. 9 taken along the line X-X, and FIG. 11 is a cross-sectional view of the organic light emitting diode (OLED) display of FIG. 9 taken along the line XI-XI.

The embodiments illustrated in FIGS. 9-11 has a similar structure to the embodiments illustrated in FIGS. 1-6 such that a description of like elements is hereby omitted, The embodiments differ in thicknesses for the odd-numbered column pixel and the even-numbered column pixel.

As shown in FIG. 9, in the organic light emitting diode (OLED) display according to some embodiments, the red pixel Roc may be disposed in the first red odd-numbered column, the green pixel Goc may be disposed in the first green odd-numbered column, and the blue pixel Boc may be disposed in the first blue odd-numbered column. Furthermore, the red pixel Rec may be disposed in the first red even-numbered column neighboring the first blue odd-numbered column, the green pixel Gec may be disposed in the first green even-numbered column, and the blue pixel Bec may be disposed in the first blue even-numbered column. Further, the red pixel Roc may be disposed in the second red odd-numbered column, the green pixel Goc may be disposed in the second green odd-numbered column, and the blue pixel Boc may be disposed in the second blue odd-numbered column.

Next, the detail structure of the organic light emitting diode (OLED) display of FIG. 9 will be described with reference to FIG. 10 and FIG. 11. FIG. 10 is a cross-sectional view of the red pixel Roc disposed in the first red odd-numbered column in the organic light emitting diode (OLED) display of FIG. 9, and FIG. 11 is a cross-sectional view of the red pixel Rec disposed in the first red even-numbered column in the organic light emitting diode (OLED) display of FIG. 9.

As shown in FIG. 10, the organic light emitting member 370 having a predetermined thickness t3 is formed in the red pixel Roc disposed in the first red odd-numbered column. Also, as shown in FIG. 11, the organic light emitting member 370 having a predetermined thickness t4 is formed in the red pixel Rec disposed in the first red even-numbered column.

The thickness t3 of the organic light emitting member of the first red odd-numbered column pixel and the thickness t4 of the organic light emitting member of the first red even-numbered column pixel are determined for the change d(y) according to the viewing angle of the first red odd-numbered column pixel to have the positive slope and for the change d(y) according to the viewing angle of the first red even-numbered column pixel to have the negative slope. Therefore, the optical characteristics of the first red odd-numbered column pixel and the first red even-numbered column pixel may compensate for one another such that the later viewing angle is improved.

Here, the thickness t3 of the organic light emitting member of the first red odd-numbered column pixel and the thickness t4 of the organic light emitting member of the first red even-numbered column pixel may be a thickness such that the change d(y) according to the viewing angle of the first red odd-numbered column pixel and the first red even-numbered column pixel is disposed in the range between about −0.1 to 0.1.

In the above embodiment, only the thickness of the organic light emitting member 370 of the red odd-numbered column pixel and the red even-numbered column pixel is described. However the thickness of the organic light emitting member 370 of the green odd-numbered column pixel and the green even-numbered column pixel may be formed as described above, and the thickness of the organic light emitting member 370 of the blue odd-numbered column pixel and the blue even-numbered column pixel may be formed as described above.

The thicknesses of the organic light emitting members 370 of the odd-numbered row pixel and the even-numbered row pixel of the same color are differently formed in the first exemplary embodiment to effectively compensate the optical characteristics of the odd-numbered row pixel and the even-numbered row pixel for improving the lateral viewing angle. However, the optical characteristics of the left portion and the right portion in one pixel may be effectively compensated by differently forming the thickness of the organic light emitting member 370 between the left portion and the right portion in one pixel to improve the lateral viewing angle.

Next, the structure for forming the thickness of the organic light emitting member 370 between the left portion and the right portion having a different thickness in one pixel in the organic light emitting diode (OLED) display accordingly some embodiments will be described with reference to FIG. 12.

FIG. 12 is a schematic diagram showing an arrangement of a plurality of pixels in an organic light emitting diode (OLED) display according to some embodiments.

The embodiment illustrated in FIG. 12 has a similar structure to the embodiments of FIGS. 1-6 above, such that a description of like elements will be omitted. The embodiment illustrated in FIG. 12 differs from the embodiments above in that an organic light emitting member having the different thicknesses between the left portion and the right portion in one pixel may be formed. As shown in FIG. 12, in the organic light emitting diode (OLED) display according to some embodiments, the red pixel Rl and Rr, the green pixel Gl and Gr, and the blue pixel Bl and Br are alternately disposed in the first odd-numbered row. Three pixels of the red pixel Rl and Rr, the green pixel Gl and Gr, and the blue pixel Bl and Br form one group, and may be repeatedly arranged according to rows.

Also, the red pixel Rel, the green pixel Gel, and the blue pixel Bel are alternately disposed in the first even-numbered row. Three pixels of the red pixel Rel, the green pixel Gel, and the blue pixel Bel form one group, and are repeatedly arranged according to rows.

One red pixel Rl and Rr may be divided into the left portion red pixel Rl and the right portion red pixel Rr, one green pixel Gl and Gr may be divided into the left portion green pixel Gl and the right portion green pixel Gr, and one blue pixel Bl and Br may be divided into the left portion blue pixel Bl and the right portion blue pixel Br.

The thickness of the organic light emitting member of the left portion red pixel and the thickness of the organic light emitting member of the right portion red pixel are determined for the change d(y) according to the viewing angle of the left portion red pixel Rl and the change d(y) according to the viewing angle of the right portion red pixel Rr to have the slope of the different polarities. Therefore, the optical characteristics of the left portion red pixel and the right portion red pixel may compensate for one another such that the later viewing angle may be improved.

The left portion green pixel Gl and the right portion green pixel Gr, and the left portion blue pixel Bl and the right portion blue pixel Br, may be formed like left portion red pixel Rl and the right portion red pixel Rr.

Here, the thickness of the organic light emitting member 370 of red, green, and blue pixels of the left portion and the thickness of the organic light emitting member 370 of the red, green, and blue pixels of the right portion may be a thickness such that the change d(y) according to the viewing angle of the left portion pixel and the right portion pixel is disposed in the range of about −0.1 to 0.1.

According to some embodiments, the thicknesses of the organic light emitting members 370 of the left portion and the right portion within one pixel are different to effectively compensate the optical characteristics of the left portion and the right portion within one pixel for improving the lateral viewing angle. However, the thickness of the upper portion and the lower portion of the organic light emitting member 370 in one pixel may be configured to effectively compensate the optical characteristics of the upper portion and the lower portion in one pixel such that the lateral viewing angle may be improved.

Next, the structure forming the upper portion and the lower portion of the organic light emitting member with the different thicknesses in one pixel in the organic light emitting diode (OLED) display according some embodiments will be described with reference to FIG. 13.

FIG. 13 is a schematic diagram showing an arrangement of a plurality of pixels in an organic light emitting diode (OLED) display according to the fourth exemplary embodiment.

The embodiment illustrated in FIG. 13 has a similar structure to the embodiments of FIGS. 1-6 above, such that a description of like elements will be omitted. The embodiment illustrated in FIG. 13 differs from the embodiments above in that an organic light emitting member having the different thicknesses between the upper portion and the lower portion in one pixel.

As shown in FIG. 13, the red pixel Ru and Rd, the green pixel Gu and Gd, and the blue pixel Bu and Bd are alternately disposed in the first odd-numbered row of the organic light emitting diode (OLED) display according to the fourth exemplary embodiment. Three pixels of the red pixel Ru and Rd, the green pixel Gu and Gd, and the blue pixel Bu and Bd form one group, and may be repeatedly arranged according to rows.

Also, the red pixel Ru and Rd, the green pixel Gu and Gd, and the blue pixel Bu and Bd are alternately disposed in the first even-numbered row. Three pixels of the red pixel Ru and Rd, the green pixel Gu and Gd, and the blue pixel Bu and Bd form one group, and are repeatedly arranged according to rows.

Here, one red pixel Ru and Rd is divided into the upper portion red pixel Ru and the lower portion red pixel Rd, one green pixel Gu and Gd is divided into the upper portion green pixel Gu and the lower portion green pixel Gd, and one blue pixel Bu and Bd is divided into the upper portion blue pixel Bu and the lower portion blue pixel Bd.

The thickness of the organic light emitting member of the upper portion red pixel and the thickness of the organic light emitting member of the lower portion red pixel are determined for the change d(y) according to the viewing angle of the upper portion red pixel Ru and the change d(y) according to the viewing angle of the lower portion red pixel Rd to have aslope of the different polarities. Therefore, the optical characteristics of the upper portion red pixel and the lower portion red pixel compensate for each other such that the later viewing angle may be improved.

The upper portion green pixel Gl and the lower portion green pixel Gr, and the upper portion blue pixel Bl and the lower portion blue pixel Br, may be formed like the upper portion red pixel Rl and the lower portion red pixel Rr.

The thickness of the upper portion of the organic light emitting member 370 of the red, green, and blue pixels and the thickness of the lower portion of the organic light emitting member 370 of the red, green, and blue pixels may be a thickness such that the change d(y) according to the viewing angle of the red, green, and blue pixels of the upper portion and the red, green, and blue pixels of the lower portion is disposed in the range of about −0.1 to 0.1.

In the present embodiment, one switching thin film transistor Qs and one driving thin film transistor Qd are described, but at least one thin film transistor and a plurality of signal lines may be additionally added.

Furthermore, the structure of the thin film transistor is not limited to the above-described structure, and may be varied such as to a bottom gate type or a top gate type.

As discussed above, an organic light emitting diode (OLED) display capable of preventing deterioration of luminance and color purity according to the viewing angle in a bottom light emitting type including a micro-cavity is disclosed.

The thicknesses of the organic emission layers of an odd-numbered row pixel and the even-numbered row pixel displaying the same color among a plurality of pixels may be different from each other. The odd-numbered row pixel and the even-numbered row pixel displaying the same color may be one of a red pixel, a green pixel, and a blue pixel.

The thickness of the organic light emitting member of the odd-numbered row pixel may be a thickness for a change d(y) of the y-axis of a C.I.E. color coordinate according to a viewing angle of the odd-numbered row pixel to be disposed in the range of about −0.1 to 0.1. The thickness of the organic light emitting member of the even-numbered row pixel may be a thickness for a change d(y) of the y-axis of the C.I.E. color coordinate according to the viewing angle of the even-numbered row pixel to be disposed within the range of about −0.1 to 0.1.

The thickness of the organic light emitting member of the odd-numbered row pixel and the thickness of the organic light emitting member of the even-numbered row pixel may be formed for the slope of the change d(y) according to the viewing angle of the odd-numbered row pixel and the slope of the change d(y) according to the viewing angle of the even-numbered row pixel to have opposite polarities.

The thickness of the organic light emitting member of the odd-numbered row pixel and the thickness of the organic light emitting member of the even-numbered row pixel may be formed for the change d(y) according to the viewing angle of the odd-numbered row pixel to have a positive slope and the change d(y) according to the viewing angle of the even-numbered row pixel to have a negative slope.

The thickness of the organic light emitting member of the odd-numbered row pixel and the thickness of the organic light emitting member of the even-numbered row pixel may be formed for the change d(y) according to the viewing angle of the odd-numbered row pixel to have a negative slope and the change d(y) according to the viewing angle of the even-numbered row pixel to have a positive slope.

The thicknesses of the organic emission layers of the odd-numbered column pixel and the even-numbered column pixel displaying the same color among a plurality of pixels may be different from each other. The odd-numbered column pixel and the even-numbered column pixel displaying the same color may be one of a red pixel, a green pixel, or and a blue pixel.

The thickness of the organic light emitting member of the odd-numbered column pixel may be a thickness for the change d(y) of the y-axis of a C.I.E. color coordinate according to a viewing angle of the odd-numbered column pixel to be disposed within the range of about −0.1 to 0.1, and the thickness of the organic light emitting member of the even-numbered column pixel may be a thickness for the change d(y) of the y-axis of the C.I.E. color coordinate according to the viewing angle of the even-numbered column pixel to be disposed within the range of about −0.1 to 0.1.

The thickness of the organic light emitting member of the odd-numbered column pixel and the thickness of the organic light emitting member of the even-numbered column pixel may be formed for the slope of the change d(y) according to the viewing angle of the odd-numbered column pixel and the slope of the change d(y) according to the viewing angle of the even-numbered column pixel such that the slopes have opposite polarities.

The thickness of the organic light emitting member of the odd-numbered column pixel and the thickness of the organic light emitting member of the even-numbered column pixel may be formed for the change d(y) according to the viewing angle of the odd-numbered column pixel to have a positive slope and the change d(y) according to the viewing angle of the even-numbered column pixel to have a negative slope.

The thickness of the organic light emitting member of the odd-numbered column pixel and the thickness of the organic light emitting member of the even-numbered column pixel may be formed for the change d(y) according to the viewing angle of the odd-numbered column pixel to have a negative slope and the change d(y) according to the viewing angle of the even-numbered column pixel to have a positive slope.

A pixel of the plurality of pixels having a different thickness may be one of a red pixel, a green pixel, or and a blue pixel. The thickness of the organic light emitting member positioned at the left portion of the pixel may be a thickness for the change d(y) of the y-axis of the C.I.E. color coordinate according to viewing angle of the left portion in the pixel to be disposed within the range of about −0.1 to 0.1, and the thickness of the organic light emitting member positioned at the right portion of the pixel may be a thickness for the change d(y) of the y-axis of the C.I.E. color coordinate according to viewing angle of the right portion in the pixel to be disposed within the range of about −0.1 to 0.1.

The thickness of the organic light emitting member positioned at the left portion of the pixel and the thickness of the organic light emitting member positioned at the right portion of the pixel may be thicknesses for the slope of the change d(y) according to the viewing angle of the left portion in the pixel and the slope of the change d(y) according to the viewing angle of the right portion in the pixel to have opposite polarities.

The thickness of the organic light emitting member positioned at the left portion of the pixel and the thickness of the organic light emitting member positioned at the right portion of the pixel may be formed for the slope of the change d(y) according to the viewing angle of the left portion in the pixel to be positive and for the slope of the change d(y) according to the viewing angle of the right portion in the pixel to be negative.

The thickness of the organic light emitting member positioned at the left portion of the pixel and the thickness of the organic light emitting member positioned at the right portion of the pixel may be formed for the slope of the change d(y) according to the viewing angle of the left portion in the pixel to be negative and for the slope of the change d(y) according to the viewing angle of the right portion in the pixel to be positive.

A pixel of the plurality of pixels having a different thickness may be one of a red pixel, a green pixel, and a blue pixel. The thickness of the organic light emitting member positioned at the upper portion of the pixel may be thicknesses for the change d(y) of the y-axis of the C.I.E. color coordinate according to viewing angle of the upper portion in the pixel to be disposed within the range of about −0.1 to 0.1, and the thickness of the organic light emitting member positioned at the lower portion of the pixel may be a thickness for the change d(y) of the y-axis of the C.I.E. color coordinate according to viewing angle of the lower portion in the pixel to be disposed within the range of about −0.1 to 0.1.

The thickness of the organic light emitting member positioned at the upper portion of the pixel and the thickness of the organic light emitting member positioned at the lower portion of the pixel may be a thickness for the slope of the change d(y) according to the viewing angle of the upper portion in the pixel and the slope of the change d(y) according to the viewing angle of the lower portion in the pixel such that the slopes have opposite polarities.

The thickness of the organic light emitting member positioned at the upper portion of the pixel and the thickness of the organic light emitting member positioned at the lower portion of the pixel may be formed for the slope of the change d(y) according to the viewing angle of the upper portion in the pixel to be positive and for the slope of the change d(y) according to the viewing angle of the lower portion in the pixel to be negative.

The thickness of the organic light emitting member positioned at the upper portion of the pixel and the thickness of the organic light emitting member positioned at the lower portion of the pixel may be formed for the slope of the change d(y) according to the viewing angle of the upper portion in the pixel to be negative and for the slope of the change d(y) according to the viewing angle of the lower portion in the pixel to be positive.

According some embodiments, in the bottom light emitting type of organic light emitting diode (OLED) display applied with the micro-cavity, the thicknesses of the organic light emitting members of the odd-numbered row pixel and the even-numbered row pixel are different such that the optical characteristics of the odd-numbered row pixel and the even-numbered row pixel compensate for one another, thereby improving the lateral viewing angle. Accordingly, the luminance and the color purity may be prevented from being deteriorated according to the viewing angle.

Furthermore, the thicknesses of the organic light emitting members of the odd-numbered column pixel and the even-numbered column pixel are different such that the optical characteristics of the odd-numbered column pixel and the even-numbered column pixel are effectively compensated to each other, thereby improving the lateral viewing angle. Accordingly the luminance and the color purity may be prevented from being deteriorated according to the viewing angle.

The thicknesses of the organic light emitting members of the left portion and the right portion in one pixel may be different such that the optical characteristics of the left portion and the right portion in one pixel compensate for one another, thereby improving the lateral viewing angle. Accordingly, the luminance and the color purity may be prevented from being deteriorated according to the viewing angle.

Furthermore, the thicknesses of the organic light emitting members of the upper portion and the lower portion in one pixel may be different such that the optical characteristics of the upper portion and the lower portion in one pixel are effectively compensated to each other, thereby improving the lateral viewing angle. Accordingly the luminance and the color purity may be prevented from being deteriorated according to the viewing angle.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display including a plurality of pixels disposed in a matrix, wherein the organic light emitting diode (OLED) display comprises:
   a substrate;
   a translucent layer formed on the substrate;
   a first electrode formed on the translucent layer;
   an organic light emitting member formed on the first electrode; and
   a second electrode formed on the organic light emitting member, wherein the second electrode includes a reflective material,
   wherein the thickness of the organic light emitting member of the odd-numbered row pixel positioned at an odd-numbered row among a plurality of pixels corresponds to a first thickness, the first thickness corresponding to a thickness for a change d(y) of a y-axis of a C.I.E. color coordinate according to a viewing angle of the odd-numbered row pixel to be disposed within the range of about −0.1 to 0.1, and the thickness of the organic light emitting member of an even-numbered row pixel positioned at an even-numbered row corresponds to a second thickness, the second thickness corresponding to a thickness for a change d(y) of a y-axis of the C.I.E. color coordinate according to a viewing angle of the even-numbered row pixel to be disposed within the range of about −0.1 to 0.1 wherein the first thickness and the second thickness being different from each other; and wherein the thicknesses of the organic emission layers of the odd-numbered row pixel and the even-numbered row pixel displaying the same color among a plurality of pixels are different from each other.

2. The organic light emitting diode (OLED) display of claim 1, wherein the odd-numbered row pixel and the even-numbered row pixel displaying the same color are one of a red pixel, a green pixel, and a blue pixel.

3. The organic light emitting diode (OLED) display of claim 1, wherein the first thickness and the second thickness are formed for the slope of the change d(y) according to the viewing angle of the odd-numbered row pixel and the slope of the change d(y) according to the viewing angle of the even-numbered row pixel respectively, and wherein the slope of a change d(y) according to the viewing angle of the odd-numbered row pixel has an opposite polarity than the slope of a change d(y) according to the viewing angle of the even numbered row pixel.

4. The organic light emitting diode (OLED) display of claim 3, wherein the first thickness and the second thickness of the organic light emitting member of the even-numbered row pixel are formed for the change d(y) according to the viewing angle of the odd-numbered row pixel to have a positive slope and the change d(y) according to the viewing angle of the even-numbered row pixel to have a negative slope.

5. The organic light emitting diode (OLED) display of claim 3, wherein the first thickness and the second thickness are formed for the change d(y) according to the viewing angle of the odd-numbered row pixel to have a negative slope and the change d(y) according to the viewing angle of the even-numbered row pixel to have a positive slope.

6. An organic light emitting diode (OLED) display including a plurality of pixels disposed in a matrix, wherein the organic light emitting diode (OLED) display comprises
a substrate;
a translucent layer formed on the substrate;
a first electrode formed on the translucent layer;
an organic light emitting member formed on the first electrode; and
a second electrode formed on the organic light emitting member, wherein the second electrode includes a reflective material,
wherein the thickness of the organic light emitting member of an odd-numbered column pixel positioned at an odd-numbered column among a plurality of pixels corresponds to a first thickness, the first thickness corresponding to a thickness for a change d(y) of a y-axis of a C.I.E. color coordinate according to a viewing angle of the odd-numbered column pixel to be disposed within the range of about −0.1 to 0.1, and the thickness of the organic light emitting member of an even-numbered column pixel positioned at an even-numbered column corresponds to a second thickness, the second thickness corresponding to a thickness for a change d(y) of a y-axis of the C.I.E. color coordinate according to a viewing angle of the even-numbered column pixel to be disposed within the range of about −0.1 to 0.1; the first thickness and the second thickness being different from each other; and wherein the thicknesses of the organic emission layers of the odd-numbered column pixel and the even-numbered column pixel displaying the same color among a plurality of pixels are different from each other.

7. The organic light emitting diode (OLED) display of claim 6, wherein the odd-numbered column pixel and the even-numbered column pixel displaying the same color are one of a red pixel, a green pixel, and a blue pixel.

8. The organic light emitting diode (OLED) display of claim 6, wherein the first thickness and the second thickness are formed for the slope of the change d(y) according to the viewing angle of the odd-numbered row pixel and the slope of the change d(y) according to the viewing angle of the even-numbered row pixel respectively, and wherein the slope of a change d(y) according to the viewing angle of the odd-numbered row pixel has an opposite polarity than the slope of a change d(y) according to the viewing angle of the even numbered row pixel.

9. The organic light emitting diode (OLED) display of claim 8, wherein the first thickness and the second thickness are formed for the change d(y) according to the viewing angle of the odd-numbered column pixel to have a positive slope and the change d(y) according to the viewing angle of the even-numbered column pixel to have a negative slope.

10. The organic light emitting diode (OLED) display of claim 9, wherein the first thickness and the second thickness are formed for the change d(y) according to the viewing angle of the odd-numbered column pixel to have a negative slope and the change d(y) according to the viewing angle of the even-numbered column pixel to have a positive slope.

11. An organic light emitting diode (OLED) display including a plurality of pixels disposed in a matrix, wherein the organic light emitting diode (OLED) display comprises:
a substrate;
a translucent layer formed on the substrate;
a first electrode formed on the translucent layer;
an organic light emitting member formed on the first electrode; and
a second electrode formed on the organic light emitting member, wherein the second electrode includes a reflective material, wherein the thickness of the organic light emitting member positioned at the left portion in one pixel is a thickness for a change d(y) of a y-axis of the C.I.E. color coordinate according to a viewing angle of the left portion in the pixel to be disposed within the range of about −0.1 to 0.1, and the thickness of the organic light emitting member positioned at the right portion in one pixel is a thickness for a change d(y) of a y-axis of the C.I.E. color coordinate according to a viewing angle of the right portion in the pixel to be disposed within the range of about −0.1 to 0.1; and wherein the thickness of the organic light emitting member positioned at the left portion in one pixel and;
wherein the thickness of the organic light emitting member positioned at the right portion in one pixel are different from each other.

12. The organic light emitting diode (OLED) display of claim 11, wherein one of the plurality of pixels is one of a red pixel, a green pixel, and a blue pixel.

13. The organic light emitting diode (OLED) display of claim 11, wherein the thickness of the organic light emitting member positioned at the left portion of the pixel and the thickness of the organic light emitting member positioned at the right portion of the pixel correspond to thicknesses for the slope of the change d(y) according to the viewing angle of the left portion in the pixel and the slope of the change d(y) according to the viewing angle of the right portion in the pixel respectively, and wherein the slope of the change d(y) according to a viewing angle of the left portion has an opposite polarity than the slope of the change d(y) according to a viewing angle of the right portion.

14. The organic light emitting diode (OLED) display of claim 13, wherein the thickness of the organic light emitting member positioned at the left portion of the pixel and the the thickness of the organic light emitting member positioned at the right portion of the pixel are formed for the slope of the change d(y) according to the viewing angle of the left portion in the pixel to be positive and for the slope of the change d(y) according to the viewing angle of the right portion in the pixel to be negative.

15. The organic light emitting diode (OLED) display of claim 13, wherein the thickness of the organic light emitting member positioned at the left portion of the pixel and the thickness of the organic light emitting member positioned at the right portion of the pixel are formed for the slope of the change d(y) according to the viewing angle of the left portion in the pixel to be negative and for the slope of the change d(y) according to the viewing angle of the right portion in the pixel to be positive.

16. An organic light emitting diode (OLED) display including a plurality of pixels disposed in a matrix, wherein the organic light emitting diode (OLED) display comprises:
a substrate;
a translucent layer formed on the substrate;
a first electrode formed on the translucent layer;
an organic light emitting member formed on the first electrode; and
a second electrode formed on the organic light emitting member, wherein the second electrode includes a reflective material,
wherein the thickness of the organic light emitting member positioned at the upper portion of the pixel is a thickness for a change d(y) of a y-axis of the C.I.E. color coordinate according to a viewing angle of the upper portion in the pixel to be disposed within the range of −0.1 to 0.1 and the thickness of the organic light emitting member positioned at the lower portion of the pixel is a thickness for the change d(y) of the y-axis of the C.I.E. color coordinate according to viewing angle of the lower portion in the pixel to be disposed within the range of −0.1 to 0.1; and wherein the thickness of the organic light emitting member positioned at the upper portion in one pixel and the thickness of the organic light emitting member positioned at the lower portion in one pixel are different from each other.

17. The organic light emitting diode (OLED) display of claim 16, wherein one of the plurality of pixels is one of a red pixel, a green pixel, and a blue pixel.

18. The organic light emitting diode (OLED) display of claim 16, wherein the thickness of the organic light emitting member positioned at the upper portion of the pixel and the thickness of the organic light emitting member positioned at the lower portion of the pixel correspond to thicknesses for the slope of the change d(y) according to the viewing angle of the upper portion in the pixel and the slope of the change d(y) according to the viewing angle of the lower portion in the pixel, and wherein the slope of the change d(y) according to the viewing angle of the upper portion in the pixel has an opposite polarity than the slope of the change d(y) according to the viewing angle of the lower portion in the pixel.

19. The organic light emitting diode (OLED) display of claim 18, wherein the thickness of the organic light emitting member positioned at the upper portion of the pixel and the thickness of the organic light emitting member positioned at the lower portion of the pixel are formed for the slope of the change d(y) according to the viewing angle of the upper portion in the pixel to be positive and for the slope of the change d(y) according to the viewing angle of the lower portion in the pixel to be negative.

20. The organic light emitting diode (OLED) display of claim 18, wherein the thickness of the organic light emitting member positioned at the upper portion of the pixel and the thickness of the organic light emitting member positioned at the lower portion of the pixel are formed for the slope of the change d(y) according to the viewing angle of the upper portion in the pixel to be negative and for the slope of the change d(y) according to the viewing angle of the lower portion in the pixel to be positive.

* * * * *